United States Patent [19]

Foster

[11] 3,746,884

[45] July 17, 1973

[54] FREQUENCY HALVING CIRCUITS

[75] Inventor: George William Foster, Bolton, England

[73] Assignee: Legg (Industries) Limited, Staffordshire, England

[22] Filed: Jan. 5, 1972

[21] Appl. No.: 215,569

[52] U.S. Cl. .......... 307/225 B, 317/148.5, 307/284, 307/247 A, 317/140

[51] Int. Cl. ...................... H03k 23/03, H03k 23/08

[58] Field of Search ..................... 307/223 B, 224 B, 307/225 B, 226 B, 282, 284, 252 J, 247 A; 317/148 J, 140

[56] References Cited

UNITED STATES PATENTS

| | | | |
|---|---|---|---|
| 3,174,059 | 3/1965 | Waterman | 307/284 |
| 3,368,083 | 2/1968 | Dowding et al. | 307/225 B X |
| 3,389,270 | 6/1968 | Schoenfeld | 307/224 B |
| 3,391,304 | 7/1968 | Fabry | 307/284 X |
| 3,439,189 | 4/1969 | Petry | 307/252 J |
| 3,564,345 | 2/1971 | Baynard | 317/140 |

*Primary Examiner*—John S. Heyman
*Attorney*—Watson, Cole, Grindle & Watson

[57] ABSTRACT

In a frequency halving circuit a relay is connected across a supply in series with a thyristor and a transistor in parallel with one another, and the relay has a contact, arranged, when the thyristor is not conducting, to connect an input pulse to trigger it, and, when the thyristor is conducting, to connect the input pulse to cause the transistor to conduct momentarily and cut off the thyristor. A member of such circuits can be combined to form the stages of a binary counter.

19 Claims, 6 Drawing Figures

Patented July 17, 1973 3,746,884

3 Sheets-Sheet 1

FREQUENCY HALVING CIRCUITS

This invention relates to frequency halving circuits and one application is to a frequency halving circuit employed as a stage in a binary counter.

According to the present invention a frequency halving circuit includes a relay connected across a supply in series with a thyristor and a transistor in parallel with one another, the relay having a contact, arranged, when the thyristor is not conducting, to connect an input pulse to trigger it, and, when the thyristor is conducting, to connect the input pulse to cause the transistor to conduct momentarily and cut off the thyristor.

Thus the relay may have a contact arranged to connect the pulse input to the thyristor gate only when the relay is de-energized. Attenuating means may be provided for reducing the pulse supply to the thyristor gate when shunted by the transistor base path. Thus the input terminal may be connected to the base of the transistor through a relay contact, and to a suitable supply terminal through a potential divider having its tapping connected to the thyristor gate.

Alternatively the relay may have a two-way contact connecting the pulse input either to the thyristor gate or to the transistor base.

The arrangement described provides a simple form of frequency halving circuit in which the relay is energized by alternate input pulses and de-energized by the intervening pulses. A number of such frequency-halving circuits may be coupled in cascade to form a binary counter.

The coupling may be effected in various ways but in one specific embodiment the input of one stage is connected through a capacitor to a point of a previous stage between the thyristor and relay. The coupling may also include a zener diode.

The relay may be a reed relay. Alternatively if additional contacts are required which cannot conveniently be provided on a reed relay the relay may be of open type. In many cases the current passed by the relay may be insufficient to keep the thyristor conducting, in which case the relay winding may be shunted by a resistor. It may also be shunted by a diode in order to suppress inductive voltage spikes.

Thus one form of the present invention provides a binary counter comprising two or more stages coupled in cascade and each including a frequency halving circuit as set forth above.

Such a counter may incorporate a direct re-set facility comprising means to supply a re-setting pulse through isolating diodes to the bases of all the transistors. Alternatively or in addition it may incorporate a direct setting facility comprising means for supplying a setting pulse through isolating diodes simultaneously to the gates of all the thyristors. In this case diodes are preferably included to prevent the setting pulses from reaching the transistor bases.

The basic frequency-halving circuit described gives a complement output, that is to say a high input gives a low output. If a normal output is required this may be obtained by providing each stage with an inverter transistor having its input connected across the thyristor of that stage.

An up-down counter capable of counting upwards or downwards may be achieved by providing a switch having contacts for simultaneously changing over the inputs of all stages after the first, from the normal outputs of the respective preceding stages to the complementary outputs, and vice versa.

Alternatively or in addition such a counter may be provided with a complement facility comprising means for supplying a complement pulse simultaneously to the count pulse inputs of all the stages simultaneously through isolating diodes. In this case preferably additional diodes are provided to prevent the complement pulse supplied to one stage from reaching the thyristor anode of a previous stage. The function of a complement facility is to changeover each digit from whichever state it is in to the other state, that is to say if it is a 0 to change it to a 1 or if it is a 1 to change it to a 0.

The counter having a complement input pulse facility lends itself to an arrangement for comparing two numbers. This can of course be done by means of an up-down counter by first feeding in the first number with the arrangement switched to count upwards from zero, then switching over the arrangement to count downwards from the number last reached, and then feeding in the second number and determining whether the result has again reached zero. In many cases however, the required apparatus will be simpler if the comparison is performed in another way. Thus in one form of the invention a circuit includes a counter as referred to incorporating a complementary input pulse facility, means for feeding in a first number, then feeding in a complement input pulse to change-over the number to its complement, and then feeding in the second number. It can be shown that if the two numbers are equal the counter will then have reached its maximum count, i.e. having started with all digits zero it will finish with all digits 1. If it fails to reach the maximum count the second number is less than the first.

The reason for this is briefly that it is a characteristic of a binary number that if each digit is changed, the number will be changed to its complement, that is to say the maximum count minus the original number. This follows from the fact that each digit must have one or other of two states and if these are denoted by A and B there is no inherent reason whether for example AAAA should be zero and BBBB the maximum count, or vice versa, and whether for example the sequence AAAA, AAAB, AABA, AABB, should be counting up from zero (in decimal notation 0,1,2,3,) or counting down from the maximum count (in decimal notation 15,14,13,12).

If it is decided that state A represents value 0 and stage B represents 1, a given sequence of letters A and B will represent a binary number corresponding to a given number of counts from zero, whereas the sequence with each letter changed will represent the number corresponding to the same number of counts down from the maximum, i.e. the complement of the first number.

It is therefore possible, in accordance with one form of the invention as referred to above, to compare two successive counts, and determine whether one exceeds the other, by entering the first count in a register, counting upwards from 0, then changing the number in the register to its complement, and then entering the second number continuing to count upwards from the complement. If the second count equals or exceeds the first the result will reach the maximum count.

The invention may be put into practice in various ways but certain specific circuits will be described by way of example with reference to the accompanying drawings in which.

Figure 1:
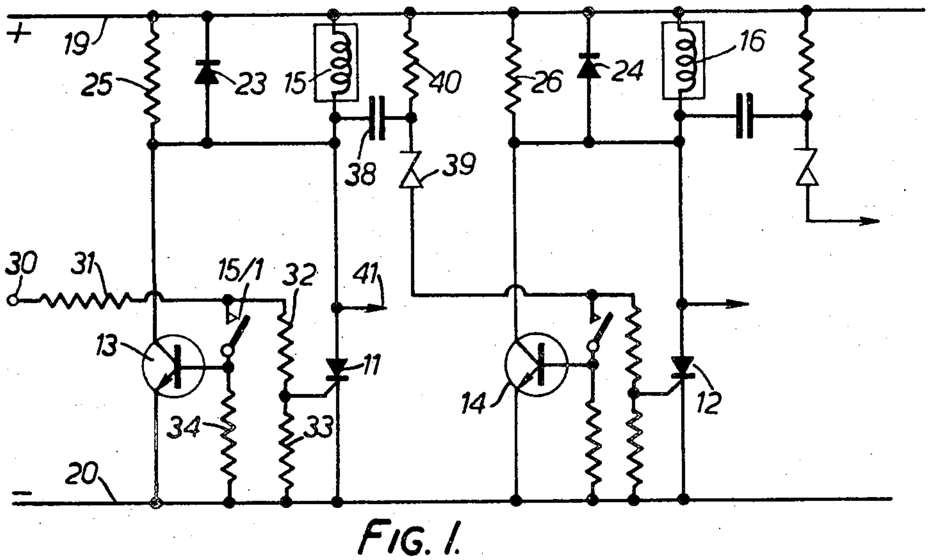
FIG. 1 is a circuit diagram of a basic counter circuit.

The basic counter shown in FIG. 1 comprises two stages each incorporating a thyristor 11 (12) connected in parallel with a transistor 13 (14). These are connected in series with a reed relay 15 (16) between a pair of supply terminals 19 and 20. The relay is shunted by a diode 23 (24) to eliminate inductive spikes when the thyristor cuts off and with a resistor 25 (26) to make up the current passed by the relay 15 (16) to that required to ensure that the thyristor 11 (12) will continue to conduct reliably.

An input count pulse terminal 30 is connected through a resistor 31 and a potential divider 32/33 to the negative supply terminal 20, the junction of the potential divider 32/33 being connected to the gate of the thyristor 11. The potential divider is shunted by a contact 15/1 of the relay 15 and a resistor 34, the junction of these being connected to the base of the transistor 13.

Thus in operation, positive going count pulses, are applied to the gate of the first stage thyristor 11 via the resistor 31.

At the first pulse the thyristor 11 conducts and energises the relay 15. Approximately 1 millisecond later the relay contact 15/1 closes to connect the base of the transistor 13 to the input count pulse terminal 30. It is necessary that the count pulse should cease before the contact 15/1 closes since otherwise oscillation may occur.

The second input count pulse is applied through the contact 15/1 to the base of the transistor 13 which accordingly conducts and momentarily applies a short circuit to the thyristor 11 which thereupon cuts off. This input count pulse does not affect the gate electrode of the thyristor since it is greatly reduced by the attenuation provided by the resistors 32 and 33 and the low input resistance of the base-emitter circuit of the transistor 13. Approximately 1 millisecond after the thyristor has cut off and the count pulse has ceased, the reed relay 15 is de-energised and the contact 15/1 opens. It will be appreciated that the reed relay 15 will be held energised by the transistor 13 until the count pulse applied to its base ceases.

The second stage is, as shown in FIG. 1, the same as the first stage, to which it is coupled through a capacitor 38 and a zener diode 39 whereof the junction is connected to the positive supply terminal 19 through a resistor 40. Thus the capacitor is connected from the output point 41, namely the thyristor anode, of the first stage whereas the zener diode 39 is connected to the input point of the second stage.

Accordingly in operation when the thyristor of the first stage conducts, the capacitor 38 charges up to the voltage of the supply through the resistor 40 and the thyristor 11, with its upstream terminal negative and its downstream terminal positive. Then, when the thyristor cuts off and de-energises the reed relay 15, the voltage at the thyristor anode, namely the upstream capacitor terminal, rises to that of the positive supply terminal 19 and since the capacitor 38 has been charged up to the supply voltage the voltage of its downstream terminal tends to rise momentarily to twice the supply volts, for example 40V. This is sufficient to pass a pulse of current through the 20V zener diode 39 and this operates as a count pulse to the input of the second stage which functions in the same manner as that described for the first stage.

The second stage only receives pulses from the capacitor 38 when the first stage switches off, i.e. at every second count pulse applied to the input of the first stage. The second stage, therefore, operates at half the frequency of the first stage.

Any number of similar stages may be provided, each stage being connected to the preceding one through a capacitor and zener diode, and operating at half the frequency of the previous stage to give a pure binary counter. Only complementary outputs can be taken from the thyristor anodes since a high positive input gives a low output.

With this form of counter the count pulse requirements are greatly simplified. The only requirements are firstly that at sometime during the pulse period the pulse has sufficient voltage and current capabilities to meet the gate triggering requirements of the thyristor, and secondly that the pulse decays to below the triggering requirements before the reed relay contact closes.

In this application it is important to choose low sensitivity thyristors (gate currents 1 mA to 10 mA) to obtain high noise immunity. The IRC10 thyristor manufactured by International Rectifier has been found suitable. The transistor gains need only be in the range 30 – 50, being defined and stabilised by resistors 33, etc.

Although the counter has been described using reed relays, other types of relays can be used.

The basic counter so far described will operate reliably between d.c. and 200 Hertz in pure binary code. When the power supply is first switched on the thyristors will always start in the turned off state so that initial resetting is not necessary. The latter characteristic affords a simple means of resetting when required, by temporarily breaking the power supply to the counter.

Figure 2:
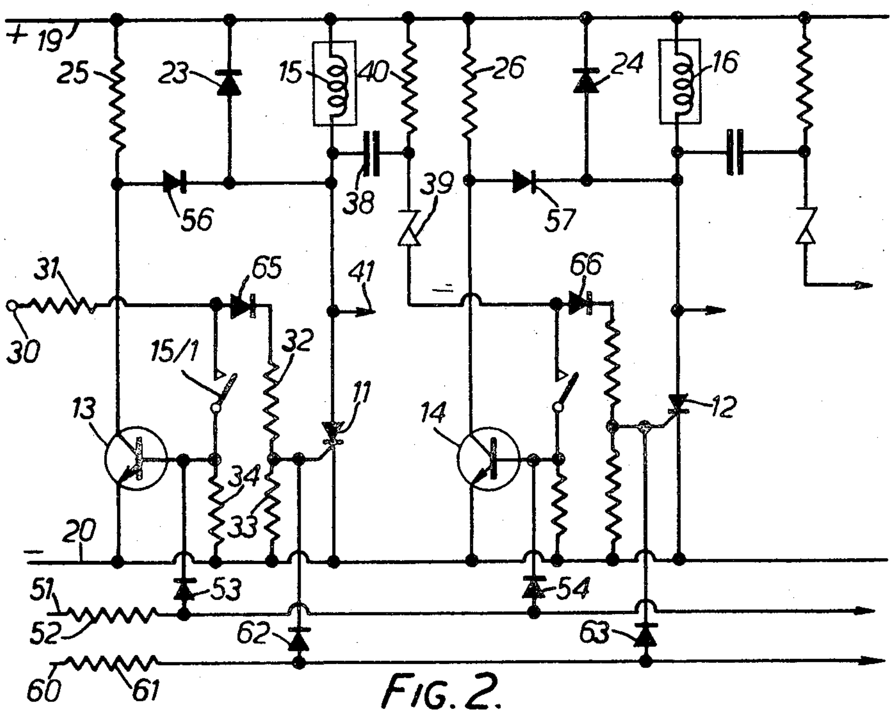
FIGS. 2 to 6 are diagrams respectively of more elaborate arrangements incorporating additional facilities.

FIG. 2 shows an arrangement providing direct set and re-set facilities. Thus, for re-setting, a re-set input 51 is connected through a resistor 52 to the base of the transistor of each stage through one of a number of isolating diodes 53, 54, etc. In addition it will be noted that diodes 56, 57, etc are included to prevent energization of the relays 15, 16, etc through the associated transistors 13, 14, etc. Thus the momentary switching on of the transistors 13, 14 will cause all the thyristors 11, 12, etc to turn off (if they are already turned on) but will not operate the reed relays. The thyristor turn off is effected in this case because the thyristor current is reduced to that passing through the reed relay coil which is insufficient to maintain the thyristor in conduction.

For the direct setting facility the direct set pulse input terminal 60 is connected through the resistor 61 to each thyristor gate through one of a number of diodes 62, 63, etc. Hence a pulse applied to this terminal 60 causes all the thyristors, which are off, to turn on. All those which are already on remain on. It will also be noted that diodes 65, 66, etc are incorporated in the connections from the count pulse input of each stage to the thyristor gate to prevent the setting pulses from affecting a transistor when the associated relay is energized and its contact is closed.

Figure 3:
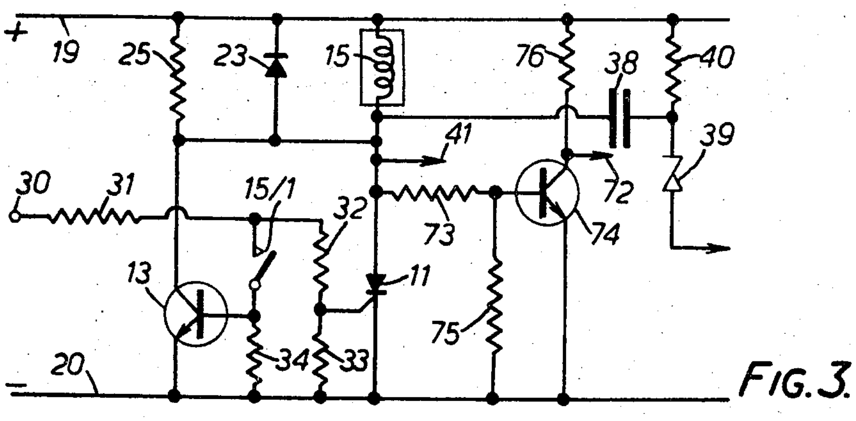

FIG. 3 shows an arrangement providing a normal output 72 in addition to the complementary output 41.

Thus the complementary output point 41, that is to say the anode of the thyristor 11, is connected through a resistor 73 to the base of a transistor 74 which is also connected to the negative supply terminal 20 through a resistor 75. The collector of the transistor 74 is connected through a resistor 76 to the positive supply terminal 19 and serves as the normal output. Thus when the thyristor 11 is turned off the transistor 74 conducts so that a high voltage on the thyristor anode gives a low voltage on the transistor collector; conversely when the thyristor conducts the transistor is switched off and gives a high voltage output. In other words the transistor acts as an inverter.

Figure 4:
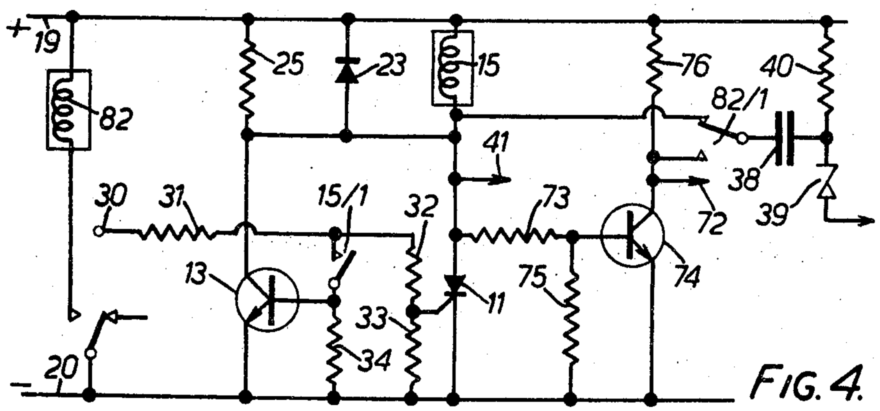

FIG. 4 shows a circuit for an up-down counter employing the inverter of FIG. 3. The circuit is the same as that of FIG. 3 except that the coupling capacitor 38 between two stages is connected to the previous stage through a two-way contact 82/1 by which it can be connected either to the normal output 72, that is to say the collector of the transistor 74, or to the complementary output 41, that is to say the anode of the thyristor 11. The contacts 82/1 of the various inter-stage couplings are arranged to be changed-over simultaneously, for example they may be the contacts of a multi-contact relay 82. With the contacts in one position for counting upwards a count will be carried from one stage to the next when the former changes from a 1 to a 0 whereas when the switch is in the other position for counting downwards the count will be carried from one stage to the next when the former changes from a 0 to a 1.

Figure 5:
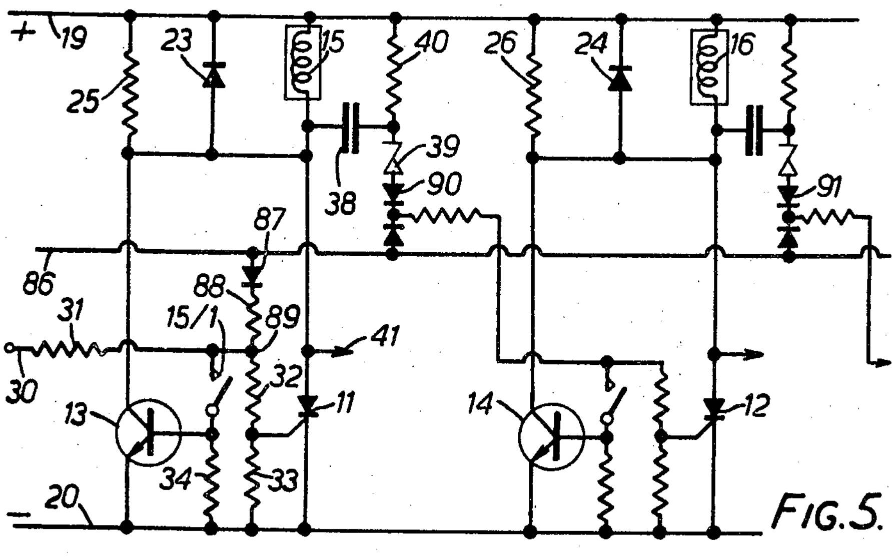

FIG. 5 shows an arrangement incorporating a direct complement input serving to changeover each state simultaneously, from whatever stage it is in to the other state. Thus a complement input pulse terminal 86 is connected through one of a number of diodes 87, etc., and one of a number of resistors 88, to each stage at the input point for the count pulse namely the junction 89 of the potential divider 32/33 with the contact 15/1 of the relay 15. Thus a complement pulse will produce the same effect in each stage as a count pulse from the previous stage (or from the input point 89) that is to say it will cause the thyristor 11 to conduct if it was not previously conducting and to cease conducting if it was previously conducting. Diodes 90, 91 etc, are connected in series with the zener diodes 39 etc, in the inter-stage couplings in order to isolate the complement pulse from the thyristor anode of the preceding stage.

An arrangement with the complement pulse can be employed to compare the number of pulses in two successive sequences without the necessity for a normal and complement output.

Figure 6:
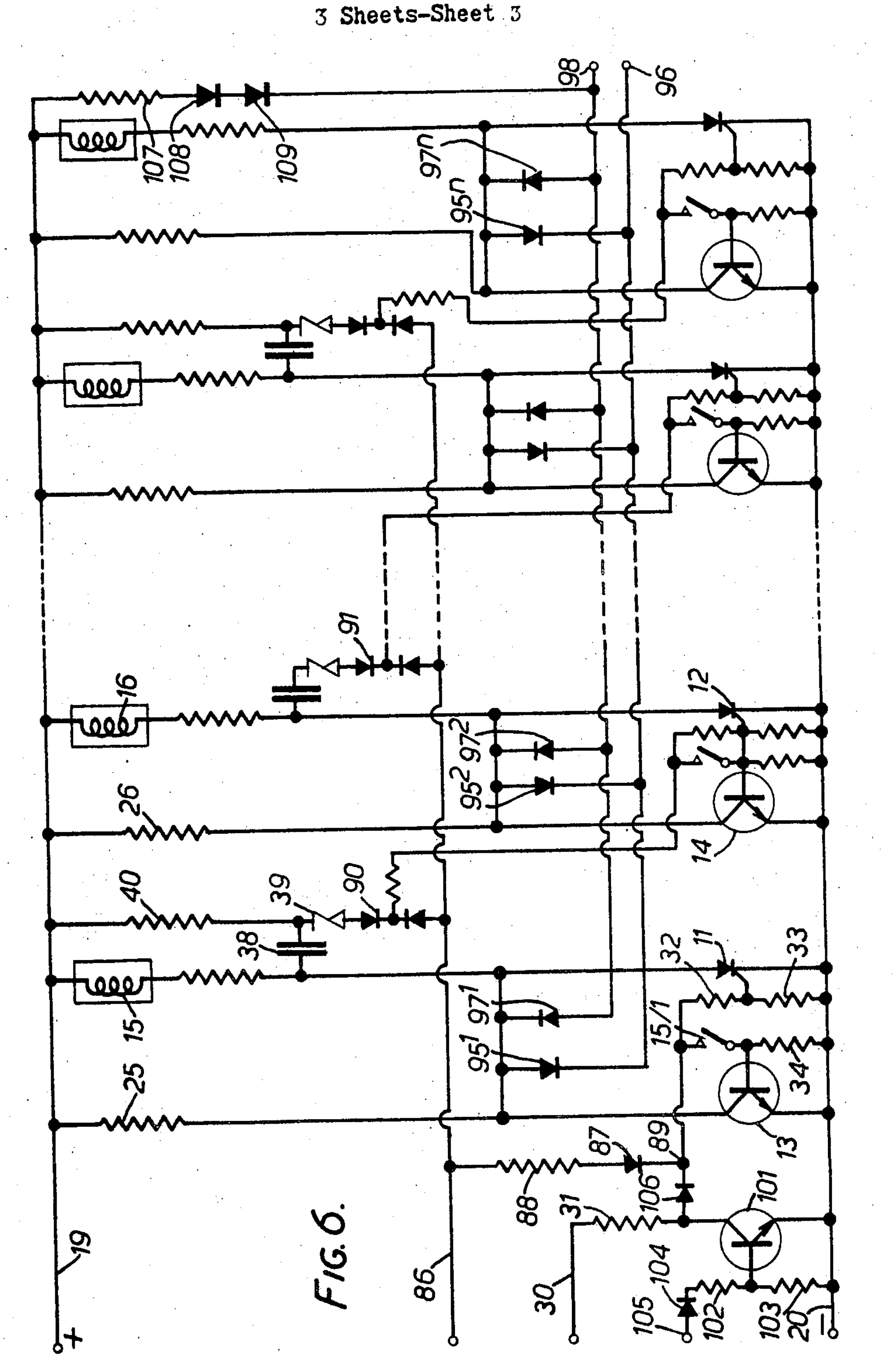

Thus FIG. 6 shows a circuit similar to that of FIG. 5 arranged for comparing two numbers by counting one of them upwards from zero, then applying a complement input pulse, and then counting the other number upwards from the said complement.

For this purpose the complement outputs of all stages are connected to the respective inputs of a multi-input AND gate. Thus the thyristor anode of each stage is connected through one of a number of diodes $95^1$, $95^2$,–. $95^n$ to a common output 96. The diodes have their cathodes connected to the common line so that a signal will continue to be received at the common output point 96 so long as any of the thyristors is not conducting, and when the signal disappears it indicates that all the thyristors are conducting, that is to say the counter is in the state of a maximum count, every digit being a 1. When this point is reached, after feeding in a first number, a complement input pulse and a second number, it indicates that the second number is equal to the first number.

The counter can then be re-set to zero by a single further input count pulse. To indicate that this has been achieved a multi input OR gate is provided in the form of a series of diodes $97^1$, $97^2$ – $97^n$ each having its cathode connected to the anode of one of the thyristors 11 etc, while their anodes are all connected to an output terminal 98 which is taken to the positive terminal 19 via a resistor 107 and diodes 108 and 109. Each of these diodes $97^1$, $97^2$ – $97^n$ will conduct when the corresponding thyristor is conducting so that if there is no signal at the output terminal it indicates that no thyristor is conducting, that is to say every digit is a 0.

In such an arrangement it may be desirable to inhibit further count pulses when either the maximum count or 0 count has been reached. For this purpose FIG. 6 shows the count pulse input by-passed by a transistor 101 having its base connected to a potential divider 102/103 connected to a diode 104 between an inhibit count input terminal 105 and the negative supply terminal 20. A diode 106 is included in the count pulse input 30 to prevent a complement pulse input being inhibited by the transistor 101.

One important advantage of the counter described is that high voltage power outputs are readily obtained to operate equipment directly without any additional interface circuitry. Output transitions as high as 200 volts can be obtained by selecting appropriate high voltage semi conductors.

What we claim as our invention and desire to secure by Letters Patent is:

1. A frequency halving circuit, comprising:
   - a relay including a normally open contact when said relay is deenergized;
   - a thyristor;
   - a transistor having a control electrode, said relay is connected in series with said thyristor across a power supply and said transistor is connected in parallel with said thyristor with said contact connected between the circuit input and said control electrode; and
   - means for providing an input pulse to trigger said thyristor when said contact is open, whereby said conducting thyristor energizes said relay to close said contact so that a next succeeding input pulse triggers said transistor through said closed contact to cause said transistor to conduct and cut off said thyristor.

2. A circuit as in claim 1 further comprising means for reducing said pulse to said thyristor gate when shunted by the transistor base path.

3. A circuit as in claim 2 further comprising a potential divider having its tap connected to the gate of said thyristor and wherein said means for providing an input pulse is connected to the base of said transistor through said relay contact and to said power supply through said potential divider.

4. A circuit as in claim 23 wherein said relay contact is a two-way contact connecting the pulse input either to the thyristor gate or to the transistor base.

5. A binary counter circuit comprising a number of frequency halving circuits as set forth in claim 1 connected in cascade.

6. A binary counter circuit as in claim 5 further comprising a capacitor and the input of one frequency halving circuit is connected through said capacitor to the junction between the thyristor and relay of a previous stage.

7. A binary counter circuit as in claim 6 further comprising a zener diode connected to said capacitor.

8. A binary counter circuit as in claim 7 wherein said relay is a reed relay.

9. A binary counter circuit as in claim 7 wherein said relay is of the open type.

10. A binary counter circuit as in claim 9 wherein the relay winding of said relay is shunted by a resistor.

11. A binary counter circuit as in claim 10 wherein said relay winding is also shunted by a diode in order to suppress inductive voltage spikes.

12. A binary counter circuit as in claim 7 further comprising a direct re-set circuit including means to supply a re-setting pulse and isolating diodes to provide said re-setting pulse to the bases of all the transistors.

13. A binary counter circuit as in claim 12 further comprising a direct setting circuit including means for supplying a setting pulse and isolating diodes to provide said setting pulse simultaneously to the gates of all the thyristors.

14. A binary counter circuit as in claim 13 further comprising additional diodes to prevent the setting pulses from reaching the transistor bases.

15. A binary counter circuit as in claim 5 wherein each frequency halving circuit includes an inverter transistor having its input connected across the thyristor of that frequency halving circuit for providing a complementary output.

16. A binary counter circuit as in claim 16 further comprising a switch having contacts for simultaneously changing over the inputs of all frequency halving circuits after the first from the normal outputs of the respective preceding stages to the complementary outputs and from the complementary outputs to the normal outputs.

17. A binary counter circuit as in claim 5 further comprising a complement circuit including means for supplying a complement pulse and isolating diodes for providing said complement pulse simultaneously to the count pulse inputs of all the stages through said isolating diodes.

18. A binary counter circuit as in claim 17 further comprising additional diodes for preventing the complement pulse supplied to one frequency halving circuit from reaching the thyristor anode of a previous frequency halving circuit.

19. A circuit for comparing two numbers comprising a binary counter circuit as in claim 18 and means for supplying one number to it, converting to the complement, and then feeding in the other number.

* * * * *

UNITED STATES PATENT OFFICE
CERTIFICATE OF CORRECTION

Patent No. 3,746,884 Dated July 17, 1973

Inventor(s) George William Foster

It is certified that error appears in the above-identified patent and that said Letters Patent are hereby corrected as shown below:

Foreign Application Priority Data

January 14, 1971 Great Britain No. 1821/71

Signed and sealed this 20th day of November 1973.

(SEAL)
Attest:

EDWARD M.FLETCHER,JR.
Attesting Officer

RENE D. TEGTMEYER
Acting Commissioner of Patents